(12) United States Patent
Häny

(10) Patent No.: US 6,829,995 B1
(45) Date of Patent: Dec. 14, 2004

(54) FORM OF A PRINTING ELEMENT IN AN OFFSET PRINTING PROCESS

(75) Inventor: Thomas Häny, Frankfurt am Main (DE)

(73) Assignee: Sandy Screen AG, Basel (CH)

( * ) Notice: Subject to any disclaimer, the term of this patent is extended or adjusted under 35 U.S.C. 154(b) by 0 days.

(21) Appl. No.: 10/019,399

(22) PCT Filed: Jun. 20, 2000

(86) PCT No.: PCT/EP00/05664

§ 371 (c)(1),
(2), (4) Date: Jun. 7, 2002

(87) PCT Pub. No.: WO01/00422

PCT Pub. Date: Jan. 4, 2001

(30) Foreign Application Priority Data

Jun. 29, 1999 (DE) ........................................ 199 29 901

(51) Int. Cl.$^7$ .............................. G03F 5/12; B41C 1/10
(52) U.S. Cl. ................. 101/463.1; 358/3.11; 101/401.1
(58) Field of Search .............................. 101/453, 463.1, 101/150, 153, 170, 395, 401, 401.1; 430/302, 306, 307; 358/3.11

(56) References Cited

U.S. PATENT DOCUMENTS

| 5,379,118 A | * | 1/1995 | Steinhardt et al. | ........... 358/3.2 |
| 5,680,222 A | * | 10/1997 | Ashworth | ................... 358/3.16 |
| 6,072,592 A | * | 6/2000 | Ashworth | .................... 358/1.9 |

FOREIGN PATENT DOCUMENTS

| DE | 2917242 | | 11/1980 |
| DE | 3711838 | | 5/1987 |
| EP | 0527655 | | 2/1993 |
| EP | 825490 | * | 2/1998 |
| FR | 1382265 | | 11/1963 |

* cited by examiner

Primary Examiner—Stephen R. Funk
(74) Attorney, Agent, or Firm—Antonelli, Terry, Stout & Kraus, LLP

(57) ABSTRACT

The printing element is in the shape of a propeller. All the printing elements in a printing dot have S-shaped sides of equal length all round. The lands between adjoining printing elements are of constant width all round a printing element. Due to this figuration, it is possible for a printing element to be mirrored about a central axis while preserving the form of the printing element, in such a way that only rounded corners are obtained because otherwise pointed corners would produce an erratic image and moiré patterns. This printing element form is thus particularly important for four-color printing.

14 Claims, 5 Drawing Sheets

FORM OF A PRINTING ELEMENT IN AN OFFSET PRINTING PROCESS

BACKGROUND OF THE INVENTION

The invention relates to a form for a printing element which is one of a plurality of printing elements, separated from one another all around by lands, on a printing unit in an offset printing process such as, in particular, rotary offset printing, the printing element being in each case of a geometric, polygonal shape.

Since printing surface production began there has been a desire in the case of the offset printing process not to use photomechanical screens and instead to imitate the old, unscreened lithography or at least to achieve the closest possible approach to it. With the development of photolithography it became increasingly clear that though printing of relatively high quality could be obtained with screens of conventional design, it was not possible to imitate the old lithographic prints. Photomechanical screens, such as the gradar screen or magenta screen for example, were very good for the recently developed photolithography and also for printing surface production but screens of this type do suffer from certain technical shortcomings such as line breakdowns, moire patterns, secondary moire patterns and resetting. There is still a desire for lithography of the original kind, that is to say printing from stone, without a screen and with the only grain being that of the surface of the stone, to be made possible as a printing element for offset printing.

Consequently, the first very general aim exists of producing unscreened lithographs. The first idea was to use the colour grain of a transparency as a basis and to separate out this granulation by means of colour separation and use it as a printing element. This attempt failed due to the inadequacies of the photographic materials used. Some success was achieved with computer programs and PostScript page-description programs. However since these screening programs are subject to a controlled randomness generator, there is the problem that, the finer the resolution of the units selected, the more difficult is it to calculate the particular gradation curve. Because of this problem screens of this type—such as the Cristall, Diamond or Harlequin HD screens—are not suitable for rotary newspaper printing presses.

A return had to be made to conventional screening for offset printing. In rotary offset printing, a printing plate is mounted on a cylinder under tension. The cylinder co-operates with a further cylinder covered with a rubber blanket and the latter co-operates in turn with an impression cylinder over which the paper to be printed on is fed. The printing points on the printing plate are prepared in such a way that they repel water and accept the greasy printing ink. The non-printing points are prepared to have an affinity for water and they repel the greasy printing ink. In printing, the whole of the printing plate is first dampened, when only the non-printing points that have an affinity for water accept the water. The printing plate, which is thus damp in parts, then travels past inking rollers which transfer the grease-containing ink to the points on the printing plate that are not damp. The image to be printed is then transferred to the blanket cylinder and from there to the paper to be printed on.

The points in a printed image which are to be inked are split up into printing elements which cannot be seen by the naked eye. Each printing element is separated from the adjoining ones by lands. The lands are not inked. The greater the total area of the lands is in a dot in the image, the lighter the dot appears to be. The proportion that the inked area represents of the total area of a dot in the image defines a grey value, the half-tone value of the dot, and is normally given as a percentage.

By means of a screen having a plurality of printing elements distributed over it, it is possible, by varying the size of the printing elements, to simulate different half-tone values. It is known for the printing elements to take the form of squares, semicircular areas, or elliptical or other geometrical areas. Given the fineness that is possible in technical terms, the sharpness of the outlines in images has not been entirely satisfactory with the known forms of printing element. This is due to the fact that even when the printing elements are of only medium size, i.e. when the relevant region of the image is of medium half-tone value, there is some join-up between the dots, thus making the sharpness of outline and the graduations of the shadows in the printed image unsatisfactory. In the form of printing element that needs to be found, the dot join-up needs to be positioned to the "rear", in the direction where the shadow lies, as far as possible, and it needs to be possible for the new form of printing element to be controlled perfectly via gradation curves.

One solution to this problem is known from the form of printing element detailed in EP A 0 825 490. The imaginary screen cells are arranged in a chessboard pattern and in each of them is arranged a printing element, so that, if a tonal value, whatever it may be, remains constant across the screen cells, the shortest distance to the adjoining printing element is of at least approximately the same size for all points on the boundary lines of a printing element. In this case the printing element is to have a substantially rhomboid area, the boundary lines of which extend in curves in such a way that they form two diagonally opposed acute angles and two diagonally opposed rounded or obtuse angles. A printing element in the form of a flag is thus formed.

The advantage that this form of printing element and its arrangement in the screen has is that, purely in theory, join-up between the dots does not take place until a half-tone value of 100%. Although this form of printing element was developed specifically for four-colour printing, Moiré patterning continues to be a disadvantage in coloured illustrations. This phenomenon can only be avoided if, for another colour such as cyan, magenta or yellow, the printing elements are rotated about their centre axis from their normal arrangement for black, which is a very laborious operation in the regulating software.

BRIEF DESCRIPTION OF THE INVENTION

The object on which the invention is based is to develop a new form of printing element with which even sharper reproduction and even finer, softer graduations in the shadows are possible, but in particular with which Moiré patterns do not occur in coloured prints, and of course while using only one and the same form for a printing element.

Starting from the experience gained with the printing element detailed in EP A 0 825 490, what is proposed as a way of achieving the stated object is that the given printing element be bounded in each case by S-shaped lines alone and the lines include an angle $\leq 90°$ at all the corners of the printing element. It is particularly useful in this case if the printing element is bounded not only by three but rather by four lines, because what is then obtained is a sort of propeller figuration having gentle, swept S-shaped lines. A clearly definable geometrical form of printing element has thus been found.

The special advantage that this figuration for a printing element has is that if the propeller is mirrored in a direction transverse to an axis running through the centre and the points of reversal and between the opposing valley and hump lines, a printing element of the same size and form is obtained. If the mirrored printing element is then coloured in a different colour, preferably in magenta as a combination colour in the case of black and in yellow as a combination colour in the case of cyan, no Moiré patterns whatever occur, which is a considerable advantage for four-colour printing. Hence the rotation of the printing element which is needed with the flag printing element to avoid Moiré patterns is unnecessary when using this propeller printing element and in this case it is only the mirrored propeller that must be used for the other colour, something which can be set without any problems with the existing software. This printing element can be used for frequencies in the range from 152 to 304 lpi.

The printing element can of course be used for four-colour printing even without the mirroring. To avoid Moiré patterns in this case the printing element has to be rotated about its central axis as known previously.

So that the printed image can have different graduations of lightness, i.e. a varying tonal value, the printing elements need to be separated from the adjoining one by an area which is not inked. In the layout envisaged in the present application, these (white) areas are always in the form of lines of constant width, in such a way that the printing elements which are arranged next to one another in the screen—without being arranged in a chessboard pattern—are so associated with one another that, at any tonal value, and even when the tonal value varies, the distances between the two adjoining sides and the next printing element are constant along the length of the side. This arrangement is a prerequisite for dot join-up between the printing elements which in each case adjoin one another not to occur until a half-tone value of approximately 100%. The result of this arrangement is soft differences in lightness and outlines of optimum sharpness in images produced with the present printing element.

Hence the present printing element can be used with advantage especially for coloured reproductions in newspaper, web-fed or sheet-fed offset printing The form of the printing element according to the invention is shown by way of example in the drawings. In the drawings:

DETAILED DESCRIPTION OF THE INVENTION

Figure 1:
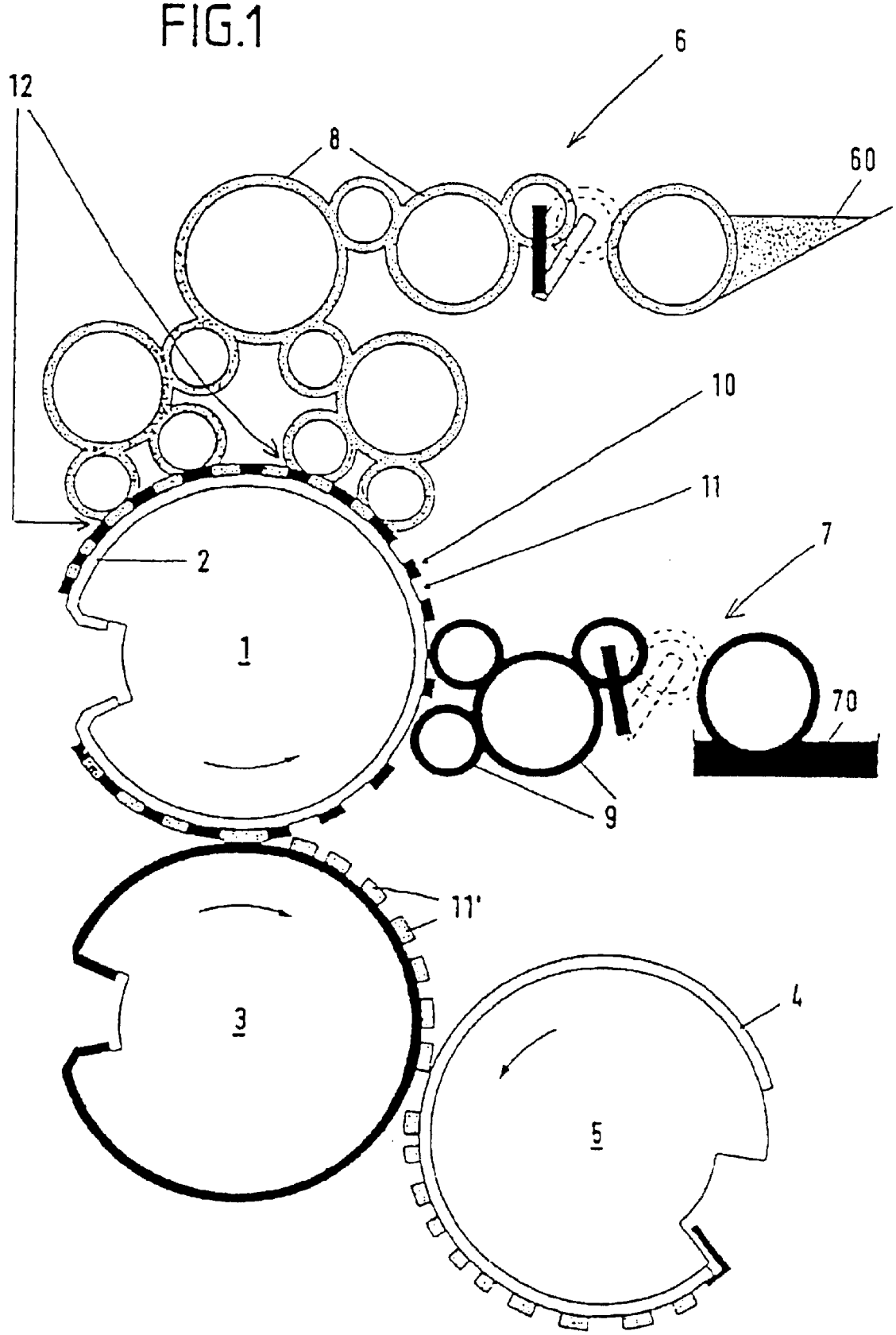
FIG. 1 is a diagrammatic section through the cylinders of a known offset printing unit.

The offset printing unit shown in FIG. 1 employs a plate cylinder 1 on which a printing plate 2 is mounted under tension. Plate cylinder 1 co-operates on the one hand with a blanket cylinder 3 and the latter in turn with an impression cylinder 5 against which is held a print substrate to be printed on, such as paper 4, and on the other hand with an inking system 6 and damping system 7. The printing ink 60 is transferred to the printing plate 2 by the inking system 6 via a number of pressure rollers 8. The water 70 is transferred by the damping system 7 via a number of further transfer rollers 9. All the rollers and cylinders operate in the opposite direction from one another, as is indicated for some of them by the arrows.

The damping system 7 transfers water 70 to non-printing points 10 on the printing plate 2, whereas the printing points 11 on printing plate 2 remain free of water. The damp points 10 repel the printing ink 60 at the points 12 at which contact is made with the contacting pressure rollers 8 while the printing points 11 accept the printing ink 60. The printing ink 60 is then transferred from printing plate 2 to blanket cylinder 3 and there forms inked points 11' which are finally printed onto the print substrate 4.

Figure 2:
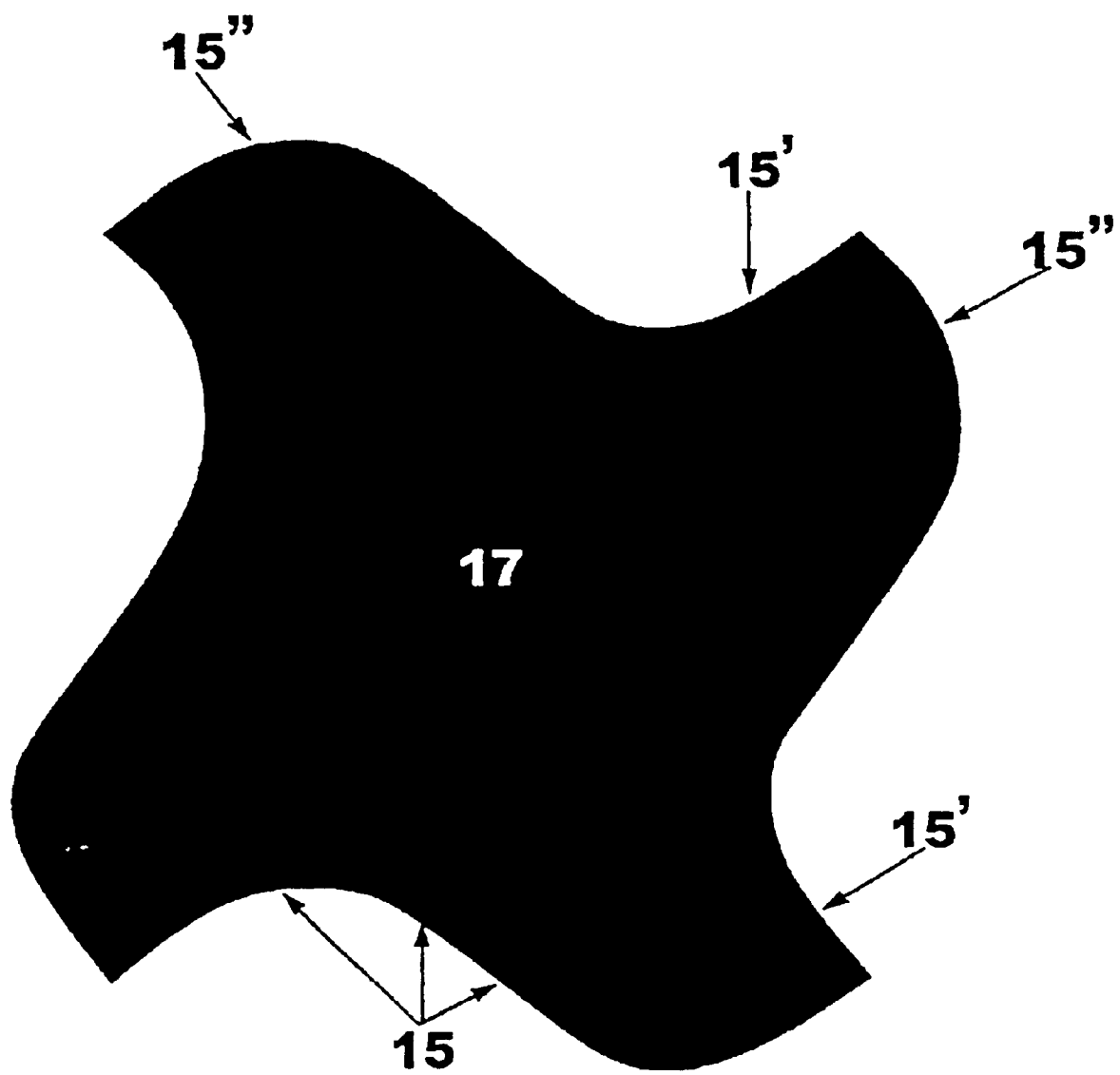
FIG. 2 is a plan view to a very much enlarged scale of a single propeller printing element.
Figure 3:
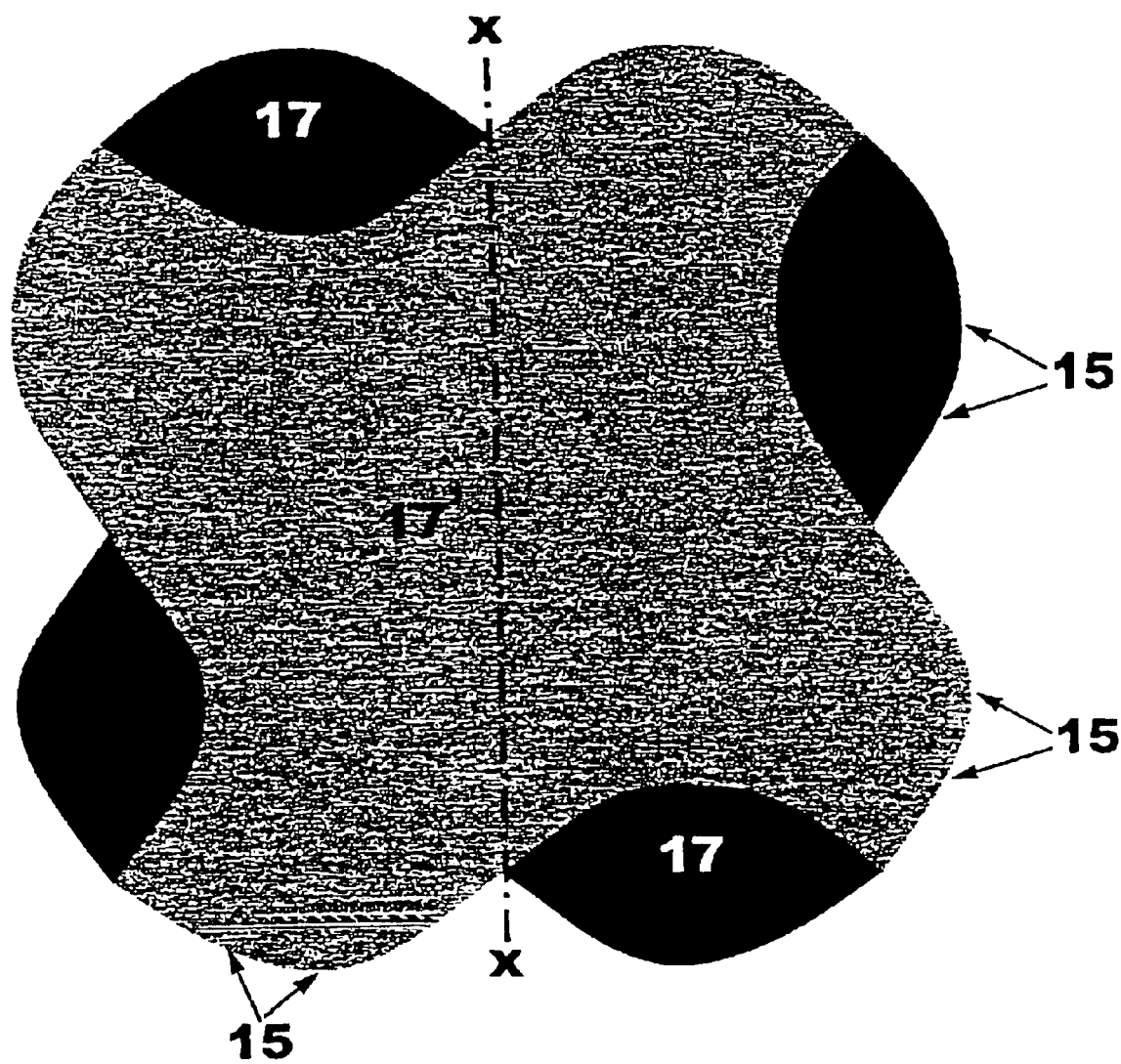
FIG. 3 shows a printing element as shown in FIG. 2 together with a mirroring about an axis X-X passing through the centre of the printing element.

The printing points 11 or inked points 11' are printing elements as shown in FIGS. 2 and 3. They are very small in practice and cannot be distinguished from one another with the naked eye. FIG. 2 is a very much enlarged view of such a printing element in the propeller figuration according to the invention. The propeller has four S-shaped lines 15 all of the same length forming its sides. Each line forming a side begins at the corner with a line descending into a valley 15' and ends with a line descending from a hump 15" or, going in the other direction, starts with a line ascending to a hump 15"0 and ends with a line ascending from a valley 15'. The S-shaped lines include an angle $\leq 90°$ at all of the corners of the printing element. If the S-shaped lines forming the sides are all the same length, what is obtained at the corners, where a line from a hump that is ending meets a line into a valley that is starting, is an angle of 90°.

The four lines forming the sides may obey the following formulas relating to the unit area of dimensions $x \in [-E;E]$ and $y \in [-E;E]$ where $E \in [0;+\infty]$, where the zero point (0;0) is the centre of the unit area.

for all the radiuses $r_i$:

$i \in [1;2;3;4;5;6;7;8]$ $r1=r2=r3=r4=r5=r6=r7=r8$ $r_i \in [E/2;+\infty]$ for point $(x_1; y_1)$:

$x_1 = E - \sqrt{(r_i 2 - (E/2)^2)}$ $y_1 = E/2$ for point $(x_2; y_2)$:

$x_2 = E/2$ $y_2 = E - \sqrt{(r_i 2 - (E/2)^2)}$ for point $(x_3; y_3)$:

$x_3 = -E/2$ $y_3 = E - \sqrt{(r_i 2 - (E/2)^2)}$ for point $(x_4; y_4)$:

$x_4 E - \sqrt{(r_i 2 - (E/2)^2)}$ $y_4 = E/2$ for point $(x_5; y_5)$ $x_5 = -E + \sqrt{(r_i 2 - (E/2)^2)}$ $y_5 = E/2$ for point $(x_6; y_6)$:

$x_6 = -E/2$ $y_6 = -E - \sqrt{(r_i 2 - (E/2)^2)}$ for point $(x_7;y_7)$ $x_7 = -E/2$ $y_7 = -E + \sqrt{(r_i 2 - (E/2)^2)}$ for point $(x_8;y_8)$:

$x_8 = E + \sqrt{(r_i 2 - (E/2)^2)}$ $y_8 = -E/2$ points $(x_i;y_i)$ are the centres of the respective radiuses for all points $(x_i;y_i)$:

$x_i \epsilon [-\infty; +\infty]$ $y_i \epsilon [-\infty; +\infty]$ the formulas being correct for a printing element as shown below:

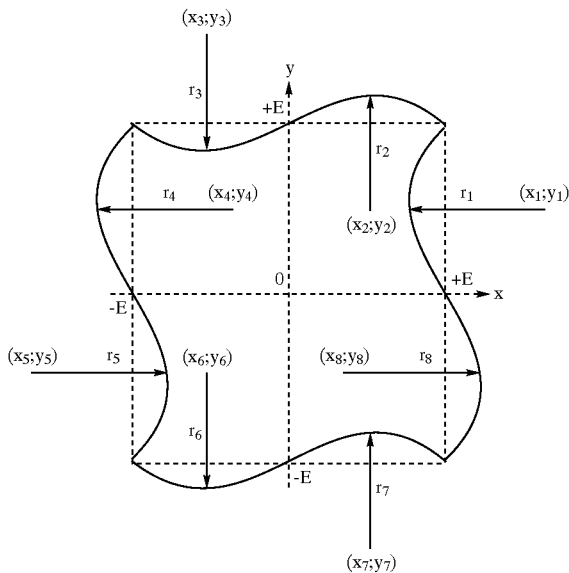

With this figuration for the printing element 17, mirroring produces an element which is of the same shape but mirrored and which; when overlaid with the main colour, shows only rounded corners. The prerequisite for this is mirroring of the printing element in a direction transverse to an axis X-X running through the centre and the points of reversal and between the opposing S-shaped lines of a printing element. FIG. 3 shows a printing element 17' which has been mirrored in this way and which is, in addition, of the same size in this case. Depending on the mixed colour that is wanted, the sizes of the two printing elements that come together may also be different in practice. What is essential is only that, with the same figuration for the printing elements and thus with no change to the software for producing the printing elements, parts of a printing element is printed unmixed in its own colour, which prevents Moire patterns. If the requisite corners of the printing element are always round after the mirroring, the Moire patterns are avoided without the printing element having to be rotated about its central axis.

Figure 4:
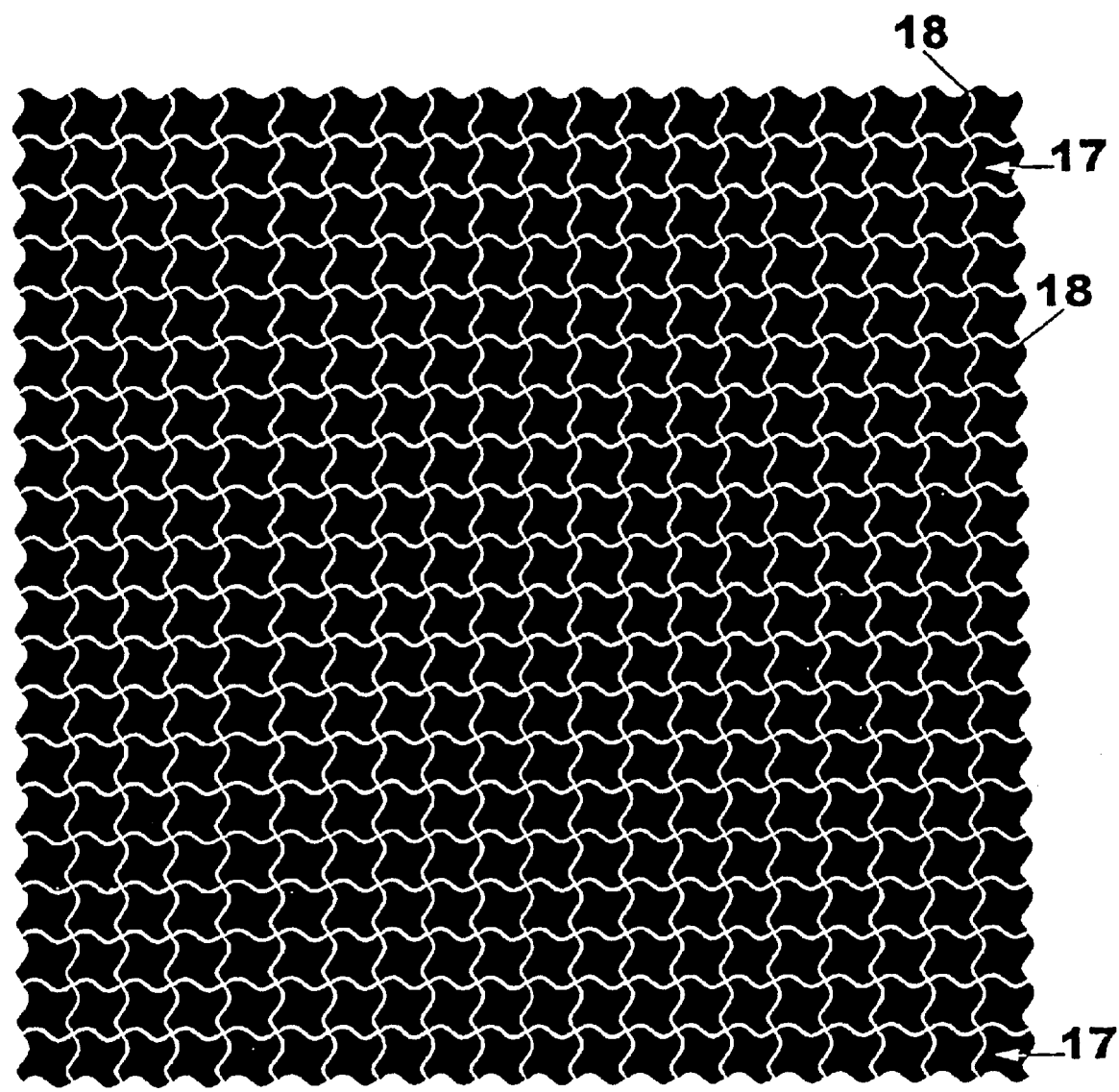
FIG. 4 shows, to a somewhat reduced scale, a number of printing elements of the same tonal value arranged next to one another.

As shown in FIG. 4, the propeller-shaped printing elements are arranged immediately next to one another in such a way that the distances between the particular two sides of those printing elements that adjoin each other in each case are always constant. The non-printing lands 18 are of a width that is always the same. This is the prerequisite for avoiding dot join-up even at tonal values which are less than 100%. In the case of the propeller-shaped printing element which is arranged over the area of a printing dot with no regard for a chessboard-type layout, there is never any dot join-up unless the particular printing dot is to be printed absolutely black.

Figure 5:
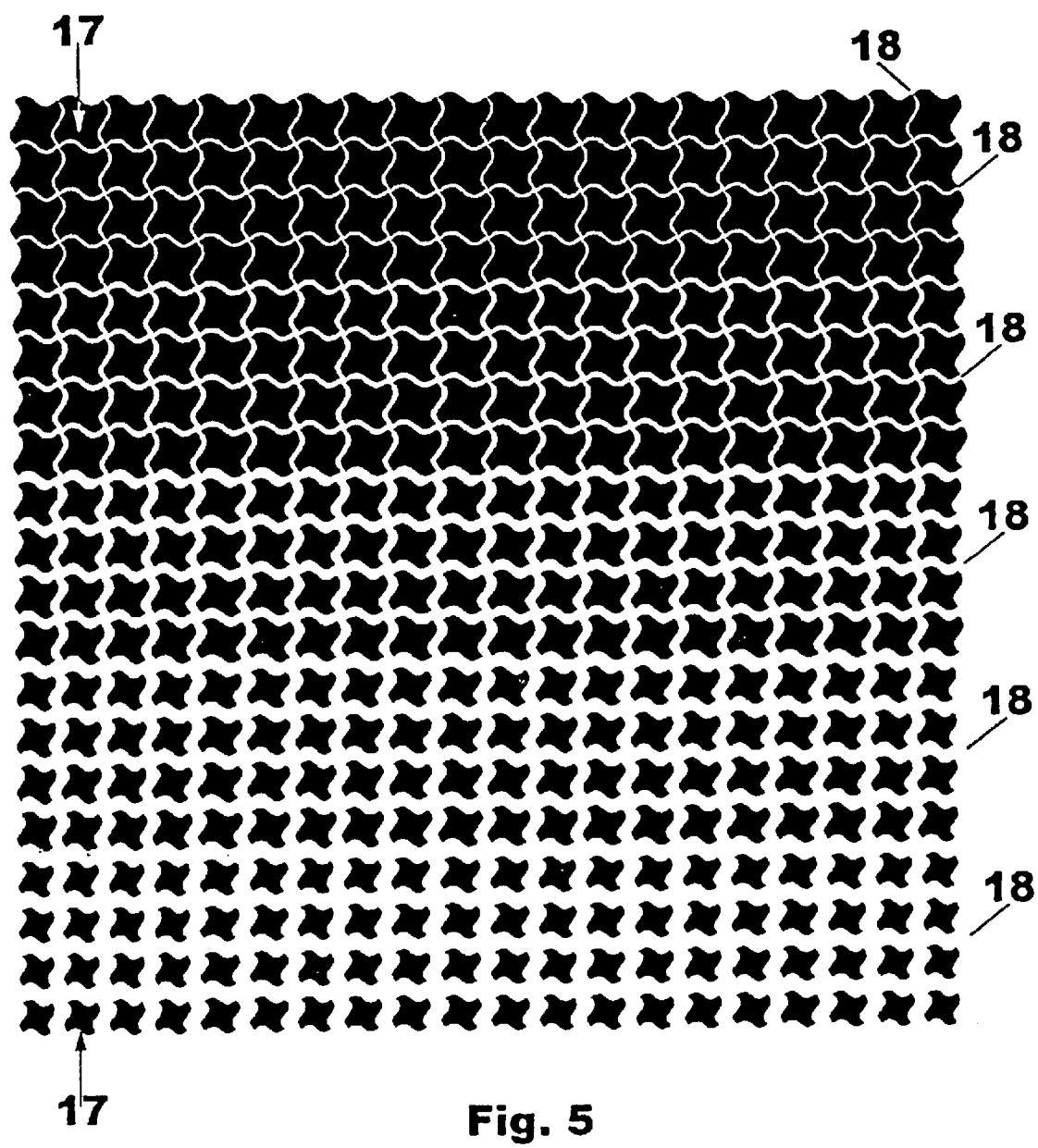
FIG. 5 shows to an enlarged scale but one which is smaller than that in FIG. 2 or 3, a number of printing elements of different sizes, i.e. of varying tonal value.

Further to the above, reference should be made to FIG. 5, where the propeller-shaped printing elements are shown unchanged but the individual distances between the printing elements, i.e. the lands 18, vary in width over the area of FIG. 5 or of the printing dot. Hence the tonal value varies as well. The printing dot becomes lighter towards the bottom of the image. The widening of the lands can take place continuously, as seen at the top, or in fairly large percentage steps, as seen at the bottom. The percentage step in the bottom part of the image is only fairly large so as to make it more clearly apparent on this scale.

What is claimed is:

1. Printing dot for simulating tonal values on a printing substrate having printing elements distributed over the area of the printing dot, characterised in that each of a plurality of the printing elements is bounded by S-shaped lines alone and the lines include an angle $\leq 90°$ at all the corners of the printing element, the printing element having at least three lines forming its sides.

2. Printing dot for simulating tonal values on a printing substrate having printing elements distributed over the area of the printing dot, characterised in that each of a plurality of the printing elements is bounded by S-shaped lines alone and the lines include an angle $\leq 90°$ at all the corners of the printing element, and in that each line forming a side starts at the corner with a line descending into a valley and ends with a line descending from a hump or, the other way round, starts with a line ascending to a hump and ends with a line ascending from a valley.

3. Printing dot according to claim 1 or 2, characterised in that the lines forming the sides of each of the plurality of printing elements are all the same length.

4. Printing dot according to claim 1 or 2, characterised in that each of the plurality of printing elements is bounded by four lines forming sides.

5. Printing dot according to claim 4, characterised in that each of the plurality of printing elements is in the form of a four-bladed propeller.

6. Printing dot according to claim 4, characterised in that the four lines forming the sides obey the following formulas relating to the unit area of dimensions $x \epsilon [-E;E]$ and $y \epsilon [-E;E]$ where $E \epsilon = [0; +\infty]$, where the zero point $(0;0)$ is the centre of the unit area.

for all the radiuses $r_i$:

$i \epsilon [1;2;3;4;5;6;7;8]$ $r1 = r2 = r3 = r4 = r5 = r6 = r7 = r8$ $r_i \epsilon [E/2; +\infty]$ for point $(x_1; y_1)$:

$x_1 = E - \sqrt{(r_i 2 - (E/2)^2)}$ $y_1 = E/2$ for point $(x_2; y_2)$:

$x_2 = E/2$ $y_2 = E = \sqrt{(r_i 2 - (E/2)^2)}$ for point $(x_3; y_3)$:

$x_3 = -E/2$ $y_3 = E - \sqrt{(r_i 2 - (E/2)^2)}$ for point $(x_4; y_4)$:

$x_4 = E - \sqrt{(r_i 2 - (E/2)^2)}$ $y_4 = E/2$ for point $(x_5;y_5)$ $x_5 = -E + \sqrt{(r_i 2 - (E/2)^2)}$ $y_5 = -E/2$ for point $(x_6;y_6)$:

$x_6 = -E/2$
$y_6 = -E - \sqrt{(r_i 2 - (E/2)^2)}$
for point $(x_7; y_7)$
$x_7 = -E/2$
$y_7 = -E + \sqrt{(r_i 2 - (E/2)^2)}$
for point $(x_8; y_8)$:
$x_8 = E + \sqrt{(r_i 2 - (E/2)^2)}$
$y_8 = -E/2$
points $(x_i; y_i)$ are the centres of the respective radiuses for all points $(x_i; y_i)$:
$x_i \in [-\infty; +\infty]$
$y_i \in [-\infty; +\infty]$
the formulas being correct for a printing element as shown below:

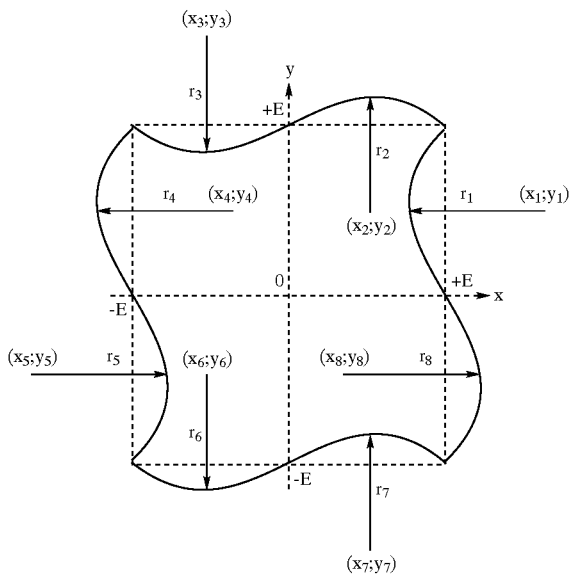

7. Printing dot according to claim 4, characterised in that each of the plurality of printing elements has blades all of the same shape.

8. Printing dot according to claim 1 or 2, characterised in that if the printing element is mirrored in a direction transverse to an axis (X-X) running through the centre and the points of reversal and between the opposing sides, a printing element of the same size and shape is obtained.

9. A process of using the printing dot according to claim 8, comprising conducting a first printing process using the printing dot having printing elements of a first colour, and conducting a second printing process using the printing dot having printing elements of a second colour, wherein the first printing dot comprises printing elements which are each a mirrored form of each printing element of the second printing dot in a different colour.

10. Process according to claim 9, for four-colour printing in the colours black, cyan, magenta and yellow, characterised in that a printing element added to by mirroring is produced by two printing elements of the colours cyan and yellow and on the other hand of the colours magenta and black.

11. Process according to claim 9, for four-colour printing in the colours black, cyan, magenta and yellow, characterised in that a printing element added to by mirroring is produced by two printing elements of the colours cyan and magenta and on the other hand of the colours yellow and black.

12. Process according to claim 9, for four-colour printing in the colours black, cyan, magenta and yellow, characterised in that a printing element added to by mirroring is produced by the two printing elements of the colours cyan and black and on the other hand of the colours magenta and yellow.

13. Printing dot according to claim 1 or 2, characterised in that the printing elements which are arranged next to one another in the printing dot—without being arranged in a chessboard pattern—are so associated with one another that, at any tonal value, and even when the tonal value varies, the distances between the two adjoining S-shaped lines forming sides and the next printing element are constant along the length of the S-shaped line forming a side.

14. Printing dot according to claim 2, characterised in that each of the plurality of printing elements has at least three lines forming its sides.

* * * * *